United States Patent [19]

Chan

[11] Patent Number: 5,860,013

[45] Date of Patent: Jan. 12, 1999

[54] FLEXIBLE INTERRUPT SYSTEM FOR AN INTEGRATED CIRCUIT

[75] Inventor: Stephen H. Chan, Sunnyvale, Calif.

[73] Assignee: Zilog, Inc., Campbell, Calif.

[21] Appl. No.: 686,888

[22] Filed: Jul. 26, 1996

[51] Int. Cl.[6] ................................................ G06F 9/46
[52] U.S. Cl. ............................................................ 395/733
[58] Field of Search ..................................... 395/733, 742

[56] References Cited

U.S. PATENT DOCUMENTS

| | | | |
|---|---|---|---|
| 4,218,739 | 8/1980 | Negi et al. | 364/200 |
| 4,896,266 | 1/1990 | Klashka et al. | 364/200 |
| 5,634,034 | 5/1997 | Foster | 395/474 |
| 5,649,208 | 7/1997 | Intrafer et al. | 395/735 |
| 5,680,599 | 10/1997 | Juggar | 395/591 |
| 5,737,548 | 4/1998 | Yach et al. | 395/308 |

*Primary Examiner*—Meng-Ai T. An
*Assistant Examiner*—David A. Wiley
*Attorney, Agent, or Firm*—Majestic, Parsons, Siebert & Hsue

[57] ABSTRACT

A flexible interrupt system for presenting interrupt signal to a microcontroller located on an integrated circuit responds to either on chip or off chip components. An interrupt circuit is connected to each bonding pad and is also connected to interrupt control logic which establishes priority for interrupt signals from the components located on chip. All interrupt signals pass through a common node in the interrupt circuit. A p channel transistor and a n channel transistor connected to the common node function as a pull up or pull down so that the microcontroller senses the rising or falling edge of the interrupt request. Since the interrupt request signals from either on chip components or off chip components pass through the common node, and the common node is directly coupled to a pad, system development and debug is simplified.

6 Claims, 5 Drawing Sheets

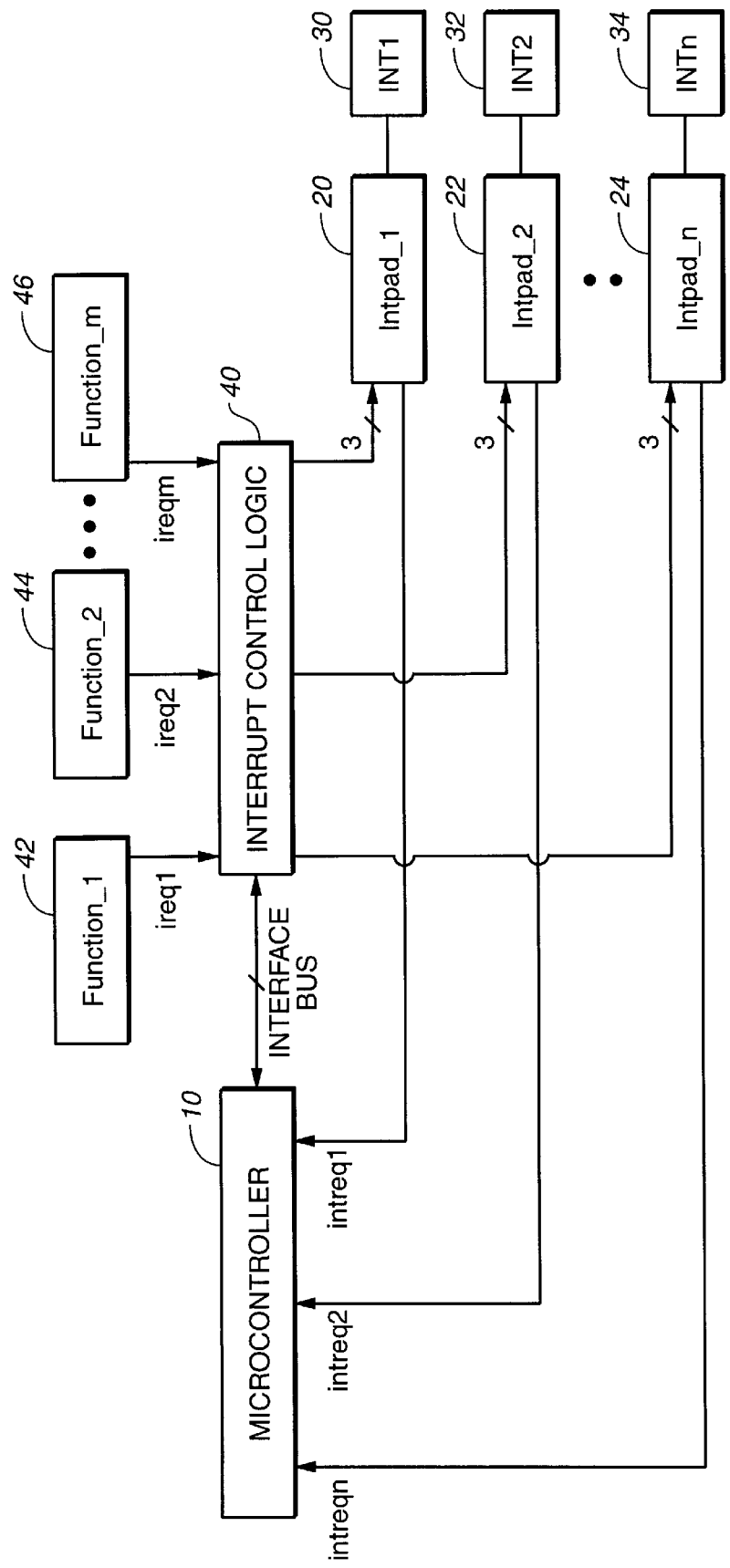
FIG._1

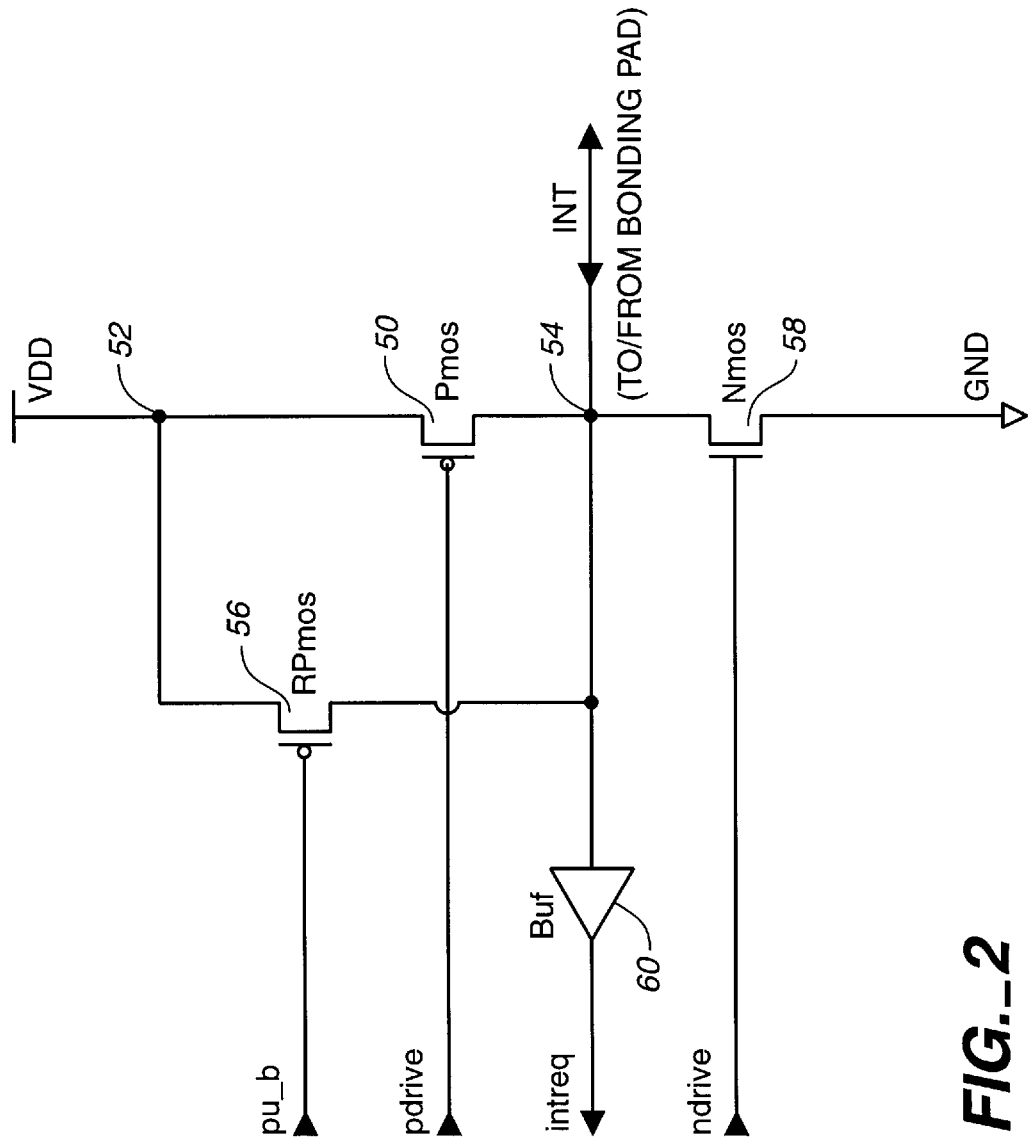
FIG._2

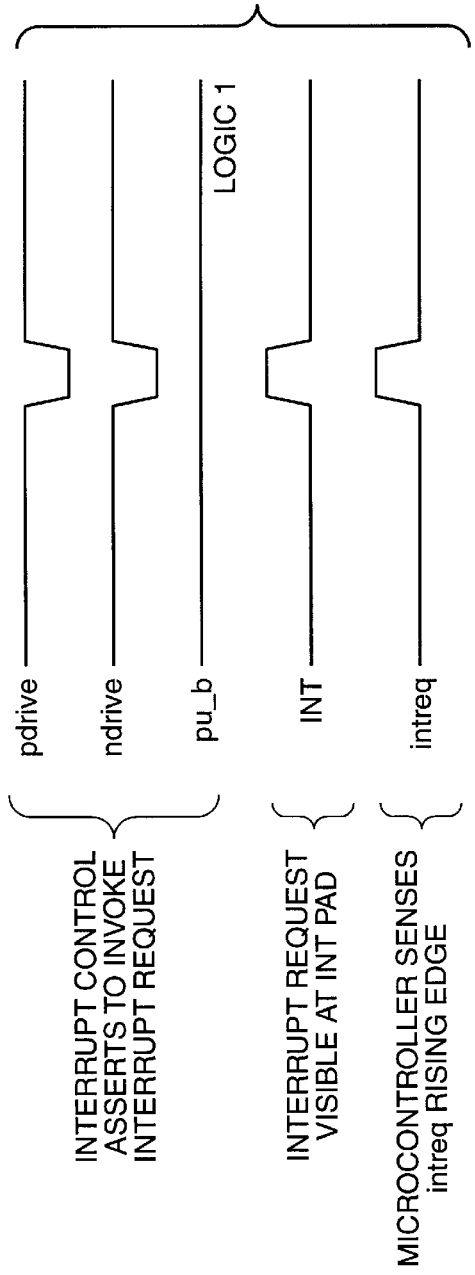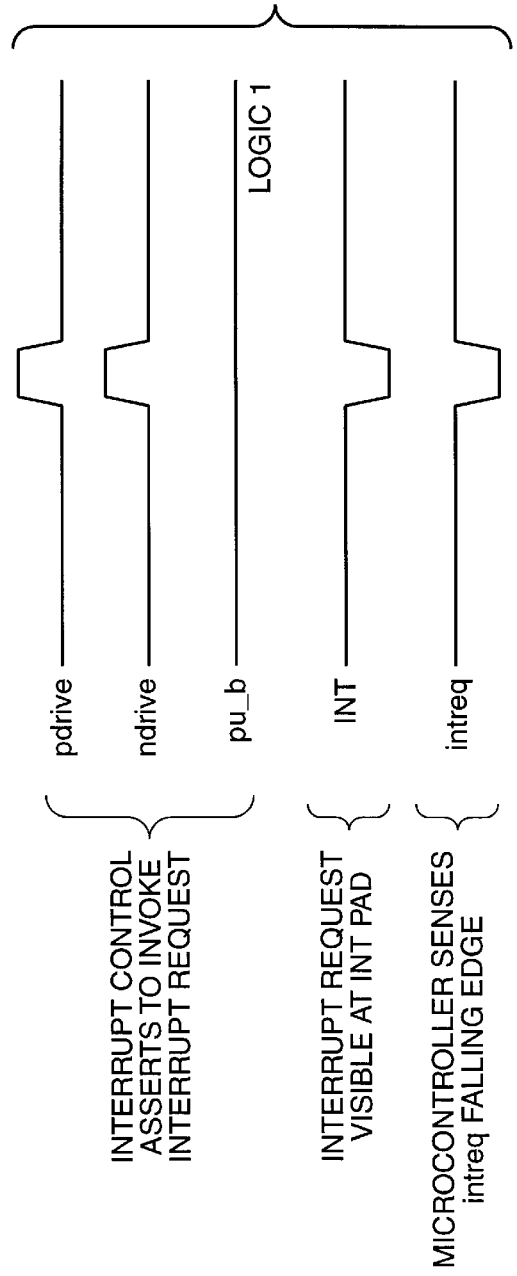

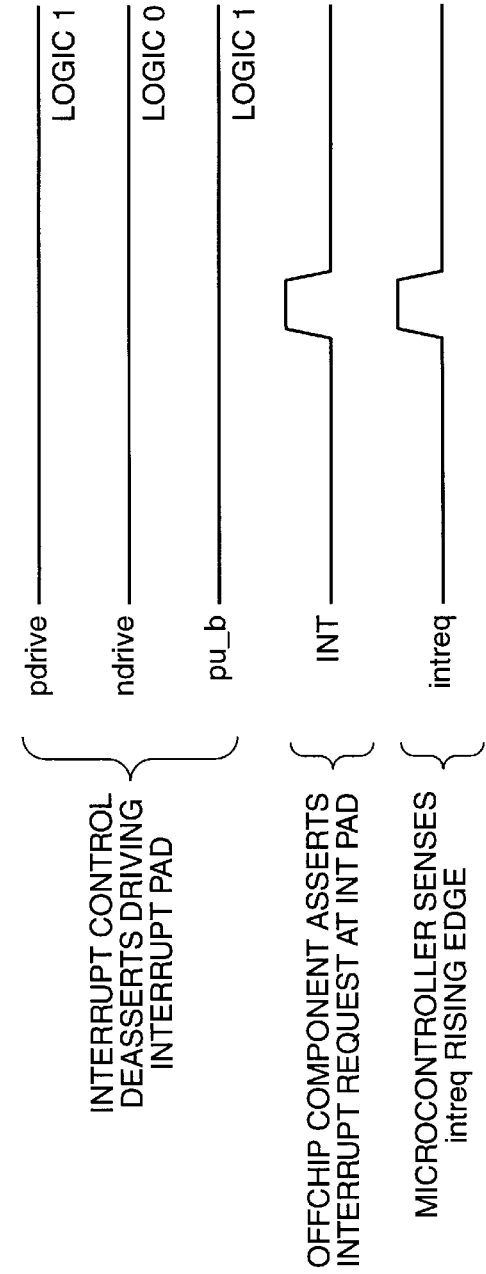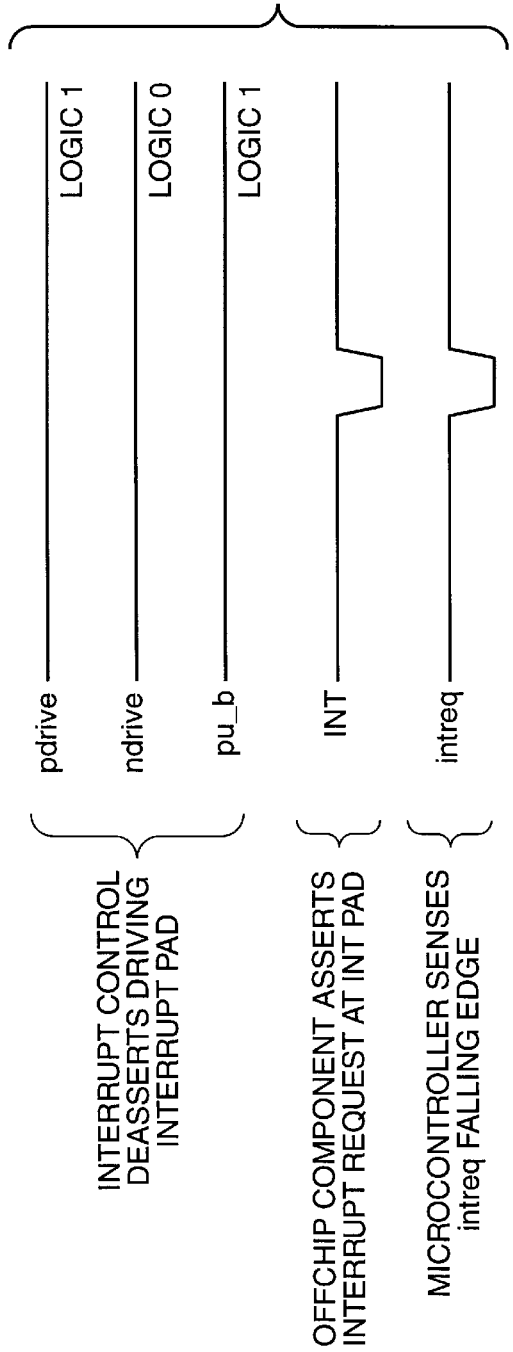

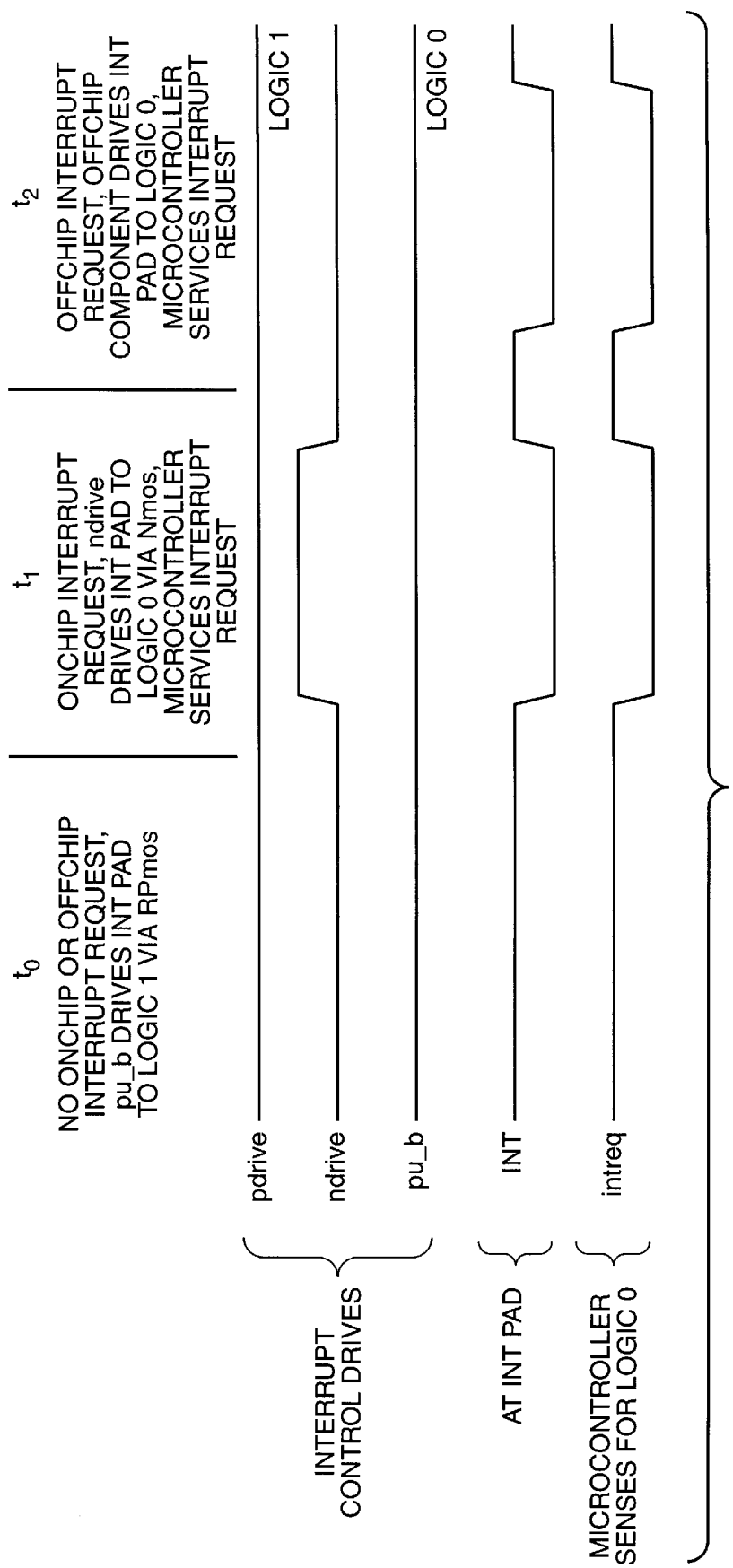
FIG._7

5,860,013

FLEXIBLE INTERRUPT SYSTEM FOR AN INTEGRATED CIRCUIT

FIELD OF THE INVENTION

This invention relates to interrupt signals to which a microcontroller responds. More specifically, this invention relates to system for presenting interrupt signals to the microcontroller located on an integrated circuit, the design of such system being particularly flexible such that the interrupt signals can be from either on chip and off chip components.

BACKGROUND OF THE INVENTION

It is well known that microcontrollers sample for the presence of an interrupt at the end of the instruction being executed. The microcontroller saves the interrupted program's next instruction address, currently residing in its program counter (pc), and then loads the starting address of the interrupt service routine. The new value then goes to the address bus so that the first instruction of the service routine can be fetched for execution.

The interrupted program address is generally saved by "pushing" it into a memory stack, which is a block of memory utilized as a first-in-last-out buffer, or by storing the address in a temporary register.

It is well known that an on chip microcontroller might service interrupt requests from either on chip components or off chip components. In systems where such multiple interrupt requests sources are present, priority resolution among the interrupt requests must be clearly established so that the microcontroller can determine which interrupt request to service. Depending on the system architecture, this priority resolution may or may not add to the interrupt latency. At the end of an interrupt service routine, the saved program address is reloaded into the microcontroller, so that the interrupted program can resume its execution. During system test and debug it is particularly helpful to access the interrupt requests so that problems, if any, can be diagnosed and corrected.

Because none of the prior art interrupt systems for a microcontroller embedded in an integrated circuit are entirely satisfactory. It is therefore desirable to provide an improved system for handling interrupt request signals on an integrated circuit which is more flexible in respond to both on chip and off chip components and yet can be easily tested and debugged.

OBJECTS OF THE INVENTION

An object of the present invention is to provide a microcontroller embedded in an integrated circuit with a flexible design such that a single interrupt input can be used to service a number of either on chip or off chip components.

Another feature of the present invention is to provide a simple yet flexible interrupt for use in a microcontroller embedded in an integrated circuit so that each of the interrupt inputs can be used to service both on chip and off chip components.

An aspect of the present invention is to provide a flexible interrupt design for a microcontroller embedded in an integrated circuit which is well suited in system development and debugging.

SUMMARY OF THE INVENTION

The above and additional objectives of the present invention are accomplished by providing integrated circuit which includes an interrupt pad circuit connected to each bonding pad. An control circuit is coupled to each interrupt circuit and establishes the priorities of interrupt signals from the plurality of components located on the integrated circuit. Interrupt signal from both on chip and off chip source pass through a common node which includes a pull up and pull down transistor. The microcontroller senses either a rising edge or falling edge of the interrupt request signal from either on chip or off chip components through the common node.

BRIEF DESCRIPTION OF THE DRAWING

FIG. 1 is a schematic diagram showing the microcontroller, the interrupt control logic, the interrupt pad circuits, and the interrupt pads;

FIG. 2 is a schematic diagram of an interrupt pad circuit;

FIG. 3 is a timing diagram of an on chip functional block invoking a rising edge interrupt request;

FIG. 4 is a timing diagram of an on chip functional block invoking a falling edge interrupt request;

FIG. 5 is a timing diagram of an off chip component invoking a rising edge interrupt request;

FIG. 6 is a timing diagram for an off chip component invoking a falling edge interrupt request;

FIG. 7 is a timing diagram for on chip and off chip components invoking interrupt request on the same interrupt pad.

DETAILED DESCRIPTION OF THE PREFERRED EMBODIMENT

One embodiment of the flexible interrupt system for a microcontroller embedded in an integrated circuit according to the present invention is seen in FIG. 1. A microcontroller 10 is connected to receive interrupt signals from the interrupt pad circuits 20, 22 and 24. A bonding pad 30, 32 and 34 is connected to each interrupt pad circuit and is the input/output port through which digital signal can be coupled to on chip or off chip components. Each interrupt pad circuit 20, 22 and 24 is connected via a bus to the interrupt control logic 40. A number of devices 42, 44 and 46 are located on chip and create interrupt signals ireq1, ireq2, . . . , ireqm which are presented to the interrupt control logic 40.

FIG. 2 depicts one embodiment of the interrupt pad circuits 20, 22 and 24. An input drive is coupled to the gate of a p channel transistor 50. The source and drain of the transistor are connected between the source voltage 52 at VDD and the node 54. A p channel transistor 56, which is a high impedance device, has its source and drain connected between the supply voltage 52 and the node 54 to receive the input signal pu_b from the interrupt control logic 40. A n channel transistor 58 has its source and drain connected between ground and the node 54. A buffer 60 has its input connected to the node 54 and provides a signal intreq to the microcontroller 10. It is important to note that the node 54 is connected directly to the bonding pad so that the signal waveforms can be monitored during system development and debugging.

Referring next to FIGS. 3–6 the operation of the flexible interrupt system for a microcontroller embedded on an integrated circuit according to the present invention will be described. The interrupt control logic 40 samples the interrupt signals from the devices 42, 44 and 46. For example, signal ireq1 is sent from the device 42 to the control logic 40 so that the priorities of the respective signals can be established. The signal pdrive enables the transistor 50 so that the rising edge of the interrupt signal can be sensed at the pad as well as by the microcontroller 10. The logic level of signal pu_b remains unchanged in a high state. In addition, the system can also respond to a falling edge trigger interrupt request from one of the on chip devices. The signal ndrive enables the transistor 58 and at the same time the signal pdrive disables the transistor 50. The logic level of signal pu_b remains unchanged in a high state so that the high impedance p channel transistor 56 is in the off state. The falling edge of the interrupt request can be detected at the pad at about the same time that the microcontroller 10 detects the falling edge of the interrupt signal.

A particular feature of the present invention is that the microcontroller 10 can respond to interrupt signals from a number of components, some of which may be on chip and some of which may be off chip. The reason is that all of the interrupt signals pass through the node 54, whether or not such signal is through the bonding pad from the external components, or from the on chip components through the interrupt control logic 40. For example, if an off chip component invokes a rising edge interrupt request signal int (FIG. 5), the p drive signal driving the transistor 50 remains high as does the signal pu_b for the transistor 56 while the signal ndrive is low. This condition deasserts the interrupt pad circuit so that the microcontroller 10 senses the rising edge of the interrupt request signal from an off chip component. In a similar manner, if an off chip components invokes a falling edge interrupt request signal int(FIG. 6), the p drive signal driving the transistor 50 remains high as does the signal pu_b for the transistor 56 while the signal ndrive is low. This condition deasserts the interrupt pad circuit so that the microcontroller 10 senses the falling edge of the interrupt signal from an off chip component.

Referring next to FIG. 7, the operation of the flexible interrupt system for an embedded microcontroller according to the present invention in which an interrupt signal comes from either an on chip component or an off chip component will now be described. At time $t_0$ there is no interrupt request signal from either the on chip components or from the off chip components. The signal pdrive is unchanged at a high state which continues to enable the transistor 50. At this same time the signal ndrive remains low so that the transistor 58 remains disabled and the node 54 stays in the high state by means of the high impedance p channel transistor in the enabled state.

Next the operation of the flexible interrupt system for an embedded microcontroller according to the present invention in response to an interrupt request from an on chip component. At time $t_1$ the on chip component 42 creates an interrupt signal ireq1 which is presented to the interrupt control logic 40. The interrupt control logic 40 presents the signal ndrive which enable the transistor 58 driving the node 54 low. Accordingly, as is seen the microcontroller senses the falling edge of the interrupt request signal.

Finally, the operation of the flexible interrupt system for an embedded microcontroller according to the present invention will be described in response to an interrupt request from an off chip component. At time $t_2$ the off chip component presents an interrupt request signal through the bonding pad 30 to the interrupt pad circuit 20. The signal pdrive to the gate of the transistor 50, the signal ndrive to the gate of the transistor 58 and the signal pu_b are unchanged at this time so that the microcontroller 10 senses the falling edge of the interrupt request. As a result, the microcontroller 10 can service the request.

While the invention has been described with respect to a preferred embodiment, it will be understood that various modifications and changes can be made without departing from the scope of the invention, which invention is limited only by the appended claims.

What is claimed:

1. An integrated circuit having a plurality of pads for providing a plurality of input/output ports through which signals can be coupled to a microcontroller, and including an embedded microcontroller for responding to interrupt request signals from on-chip components or from off-chip components, comprising:

interrupt logic means for receiving interrupt request signals from on-chip components and for prioritizing said interrupt request signals in a predetermined manner, and for routing such requests to said microcontroller; and an interrupt pad circuit means coupled to said interrupt logic means to receive interrupt request signals from said on-chip components, and also coupled to at least one of said input/output ports to receive signals from said off-chip components, and for providing such interrupt signals to said embedded microcontroller, wherein said interrupt pad circuit includes a first node coupled to receive interrupt request signals from components located on-chip, and for receiving interrupt request signals from off-chip components, wherein the on-chip interrupt request signal is detectable at the at least one of said input/output ports connected to the node.

2. An integrated circuit according to claim 1, wherein said interrupt pad circuit means includes a p channel transistor having its source and drain connected between a supply voltage and said first node, and an n channel transistor having its source and drain connected between said first node and ground.

3. An integrated circuit according to claim 2, wherein said p channel transistor of said interrupt pad circuit means and said n channel transistor of said interrupt pad circuit means each has its gate connected to said logic means for receiving interrupt request signals.

4. An integrated circuit according to claim 1, wherein said interrupt pad circuit means includes a second p channel transistor having its source and drain connected between said supply voltage and said first node.

5. An integrated circuit according to claim 4, wherein said second p channel transistor has its gate connected to said interrupt control logic means.

6. An integrated circuit having a plurality of pads for providing a plurality of input/output ports through which signals can be coupled to a microcontroller, and including an embedded microcontroller for responding to interrupt request signals from on-chip components or from off-chip components, comprising:

interrupt logic means for receiving interrupt request signals from on-chip components and for prioritizing said interrupt request signals in a predetermined manner, and for routing such requests to said microcontroller; and an interrupt pad circuit means coupled to said interrupt logic means to receive interrupt request signals from said on-chip components, and also coupled to at least one of said input/output ports to receive signals from said off-chip components, and for providing such interrupt signals to said embedded microcontroller, wherein the interrupt request signals from on-chip components and off-chip components are coupled through a first node, wherein said first node is connected to a pad by an electrically conductive path.

* * * * *